US007799408B2

(12) United States Patent
Hori et al.

(10) Patent No.: US 7,799,408 B2
(45) Date of Patent: Sep. 21, 2010

(54) CONDUCTIVE POWDER, CONDUCTIVE COMPOSITION, AND PRODUCING METHOD OF THE SAME

(75) Inventors: Shigeo Hori, Osaka (JP); Hirohiko Furui, Shiga (JP); Tadashi Kubota, Tokyo (JP); Yoshiaki Kubota, Tokyo (JP)

(73) Assignee: Kaken Tech Co. Ltd., Osaka (JP)

( * ) Notice: Subject to any disclaimer, the term of this patent is extended or adjusted under 35 U.S.C. 154(b) by 1170 days.

(21) Appl. No.: 11/411,569

(22) Filed: Apr. 26, 2006

(65) Prior Publication Data

US 2006/0226398 A1    Oct. 12, 2006

Related U.S. Application Data

(63) Continuation-in-part of application No. 10/426,806, filed on May 1, 2003, now abandoned, which is a continuation-in-part of application No. PCT/JP01/10228, filed on Nov. 22, 2001.

(30) Foreign Application Priority Data

| Jan. 24, 2001 | (JP) | ............................. 2001-053113 |
| Nov. 1, 2002 | (JP) | ............................. 2002-319274 |
| Nov. 1, 2002 | (JP) | ............................. 2002-319275 |

(51) Int. Cl.
*B05D 7/14* (2006.01)

(52) U.S. Cl. ................. 428/203; 252/500; 252/512; 252/513; 252/514; 427/212; 427/216; 427/217; 427/222; 427/404; 75/255

(58) Field of Classification Search ................. 252/500, 252/512–514; 428/402, 403, 407; 427/222; 524/439, 440
See application file for complete search history.

(56) References Cited

U.S. PATENT DOCUMENTS

| 4,888,135 A | * | 12/1989 | Tsunaga et al. ............. 252/512 |
| 5,178,909 A | * | 1/1993 | Hayashi ...................... 427/216 |
| 5,945,158 A | * | 8/1999 | Djokic et al. ............... 427/216 |

FOREIGN PATENT DOCUMENTS

| JP | 05-314813 A | | 11/1993 |
| JP | 07-205395 A | | 8/1995 |
| JP | 08287724 | * | 11/1996 |
| JP | 11-073818 | * | 3/1999 |

* cited by examiner

*Primary Examiner*—Stanley Silverman
*Assistant Examiner*—Kallambella Vijayakumar
(74) *Attorney, Agent, or Firm*—Carmody & Torrance LLP

(57) ABSTRACT

The present invention provides an Ag or Ni conductive powder, which can show the high conductivity even in condition that a resin is included and can has the narrow particle size distribution, and a conductive composition using the same, and a producing method of the same.

In such an Ag or Ni conductive powder, a conductive composition and a producing method of the conductive powder, the conductive powder having a convex radially extended and a concave, wherein a core material which is at least one particle selected from the group consisting of an organic type particle, a metal type particle and a ceramic type particle is included into the conductive powder.

4 Claims, 11 Drawing Sheets

(a)

(b)

(c)

(a)

(b)

(a)

(b)

ated to a conductive powder, a conductive composition, and a producing method of the conductive powder, and more particularly to a conductive powder for an electrical industry which can show the highly conductivity (low resistivity) even in condition that a resin is included, and the narrow particle size distribution, a conductive composition using the same, and a producing method of the same.

CONDUCTIVE POWDER, CONDUCTIVE COMPOSITION, AND PRODUCING METHOD OF THE SAME

CROSS REFERENCE TO RELATED APPLICATIONS

This application is a continuation-in-part of application Ser. No. 10/426,806, filed May 1, 2003 now abandoned, which is continuation-in-part of International Application No. PCT/JP01/10228, filed Nov. 22, 2001.

TECHNICAL FIELD

The present invention relates to a conductive powder, a conductive composition, and a producing method of the conductive powder, and more particularly to a conductive powder for an electrical industry which can show the highly conductivity (low resistivity) even in condition that a resin is included, and the narrow particle size distribution, a conductive composition using the same, and a producing method of the same.

BACKGROUND ART

Conventionally, a conductive composition constituted from the mixing of a definite amount of a metal powder into a resin, has been widely used in the paste for thick conductor, a conductive adhesive and the like.

As such metal powders used in the conductive composition, for example, a reduced Ag powder made from the reduction reaction from Ag (silver) nitrate by using the reducing agent such as hydrazine, formaldehyde, and ascorbic acid are known and disclosed in JP H8-92611A and the like. Also, in JP H10-183208A and the like, a fine non-aggregated Ag powder and a flake type Ag powder made from pyrolysis are disclosed. Also, in JP H7-109501A and the like, a fine non-aggregated Ag powder and a flake type Ag powder made from grinding procedure are disclosed. Moreover, in JP H9-125110A, a dendrite Ag powder made from electrolysis is disclosed.

However, since every conventional metal powders is aiming to conduct via point contacting of the surfaces of the adjoining metal powders, there has been the drawbacks that the contact area is small and the conductive resistance between the conductive substrates in condition that a resin is included, is high.

Further, the conventional metal powders generally show the low conductivity in condition that a resin is included, and many metal powders are required into the resin to obtain the fixed conductive resistance between the conductive substrates. Therefore, there were the drawbacks that the viscosity of the conventional conductive composition becomes high and the handling-ability becomes worse. To improve the handling-ability, the additional quantity is restricted to be the low level and much diluent such as organic solvents are required.

Thus, the mixing usage of spherical Ag powder and Ag flake powder has been proposed. However, as shown in the comparative example 1 of table 2, the electrical resistivity for the conductive composition obtained from mixing the plural conductive powders was about $1.4 \times 10^{-3} \Omega \cdot cm$ which was insufficient. On the other hand, the conventional metal powders have the broader particle size distribution, which may cause the short-circuit problem or insufficient mixing problem into the resin.

In view of the above drawbacks, inventors of the present invention have keenly studied and found that a conductive powder which can show the highly conductivity (low resistivity) even in condition that a resin is included, and the narrow particle size distribution, can be obtained by including the core material to strengthen the crystal growth reaction and forming the convex radially extended and a concave among the convex.

Accordingly, it is an object of the present invention to provide a conductive powder which can show the highly conductivity (low resistivity) even in condition that a resin is included and can has the narrow particle size distribution, and a conductive composition using the same, and a producing method of the same.

SUMMARY OF THE INVENTION

[1] According to the present invention, there is provided an Ag or Ni conductive powder having a convex radially extended and a concave among the convex, wherein a core material which is at least one particle selected from the group consisting of an organic type particle, a metal type particle and a ceramic type particle is included into the conductive powder, whereby the above-mentioned drawbacks can be solved.

Thus, by constituting the Ag or Ni conductive powder like this, a convex radially extended and a concave among the convex are easily press-fitted or contacted in condition that the convex is partially inserted in the concave, so that the adjoining conductive powders can contact in a big area respectively. Accordingly, they are similar to a plug and a socket for the electrical wiring and high conductivity (low resistivity) can be obtained in condition that the additional quantity of the conductive powder is relative low level. In addition, the specific shape of the conductive powder can be retained for a long time since the core material is included into the conductive powder. Moreover, it becomes easy to control the specific gravity and the electrical resistivity since a definite quantity of the core material which specific gravity and the electrical resistivity are different, is included into the conductive powder.

[2] According to the other embodiment of the present invention, there is provided a conductive composition using an Ag or Ni conductive powder having a convex radially extended and a concave among the convex and a resin, wherein a core material which is at least one particle selected from the group consisting of an organic type particle, a metal type particle and a ceramic type particle is included into the conductive powder.

By constituting the conductive powder like this, high conductivity (low resistivity) can be obtained in condition that the additional quantity of the conductive powder is relative low level.

[3] According to the other embodiment of the present invention, there is provided a producing method for an Ag or Ni conductive powder having a convex radially extended and a concave among the convex by using the solution reduction method, wherein the following steps (a) to (b) are included.

(a) To prepare step a core material to strengthen the crystal reaction such as Ag or Ni, (b) To form an Ag or Ni conductive powder by reaction Ag nitrate or Ni nitrate with the reduction agent at the presence of the core material.

By carrying out the producing method of the conductive powder like this, Ag or Ni conductive powder having a low resistivity, a narrow particle size distribution, and a good retaining ability in the specific shape, can be efficiently obtained.

DESCRIPTION OF THE PREFERRED EMBODIMENTS

First Embodiment

First embodiment of the present invention is directed to an Ag or Ni conductive powder having a convex radially extended and a concave among the convex, wherein a core material which is at least one particle selected from the group consisting of an organic type particle, a metal type particle and a ceramic type particle is included into the conductive powder.

Also, it is favorable for the conductive powder to have the following features;

(1) the convex and concave of the adjoining conductive powders are mutually press-fitted to form a conductive path (first feature).
(2) the shape of the convex is at least one shape selected from the group essentially consisting of a needle shape, a rod shape and a petal shape (second feature).
(3) the electrical resistivity is within a range of $5 \times 10^{-6}$ to $1 \times 10^{-3} \Omega \cdot cm$ in condition that a resin is included according to the measurement method described in reference example 1 (third feature).

Here, it is favorable to have at least one feature among the above-mentioned 1 to 3 features, but it is more favorable to have more than one feature.

1. Shape (1) Convex

Figure 1:
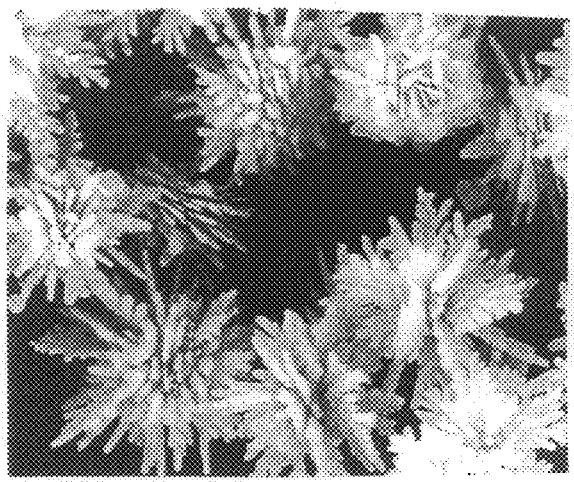
FIG. 1 is the electron microscope photos of the conductive powders (3 types) according to the present invention (×4000, ×8000, ×4000).
Figure 1:
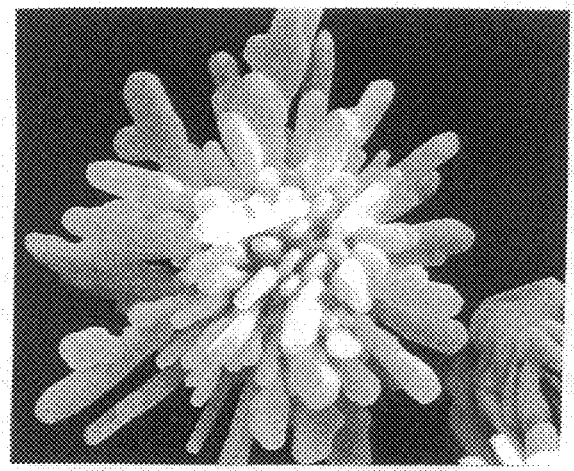
Figure 1:
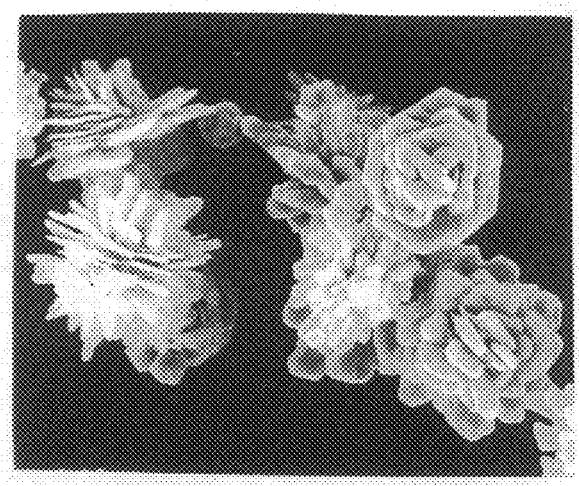
Figure 2:
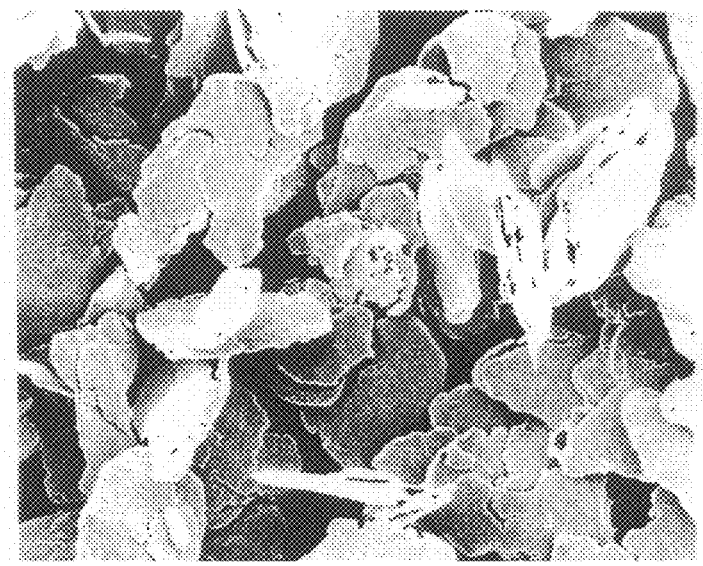
FIG. 2 is the electron microscope photos of the conventional conductive powders (2 types) (×5000).
Figure 2:
Figure 2:
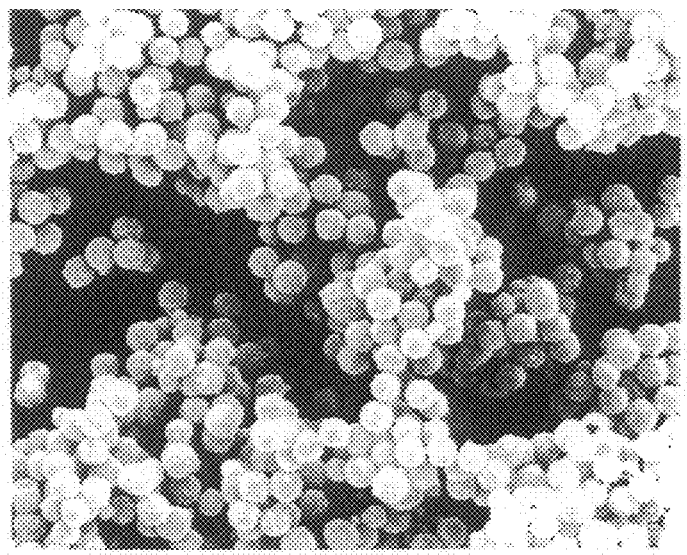
Figure 2:

The shape of the convex is favorable at least one shape selected from the group essentially consisting of a needle shape, a rod shape (including a pole shape or a bar shape) or a petal shape as illustratively shown in FIG. 1(a), (b) and (c).

The reason of this is that the convex radially extended and the concave among the convex is easily press-fitted between the adjoining conductive powders and the electrical path is easily formed.

Here, the conductive composition including the combination of a Ag powder having the needle type convex, a Ag powder having the rod type convex and a Ag powder having the petal type convex shows the better electrical conductivity since an electrical path are easily formed. More concretely, the conductive composition including the combination of 10 to 50 wt. % of a Ag powder having the needle type convex, 15 to 50 wt. % of a Ag powder having the rod type convex and 20 to 50 wt. % of a Ag powder having the petal type convex based on the total 100% weight, can show the electrical conductivity of $5 \times 10^{-6}$ to $5 \times 10^{-5} \Omega \cdot cm$.

The length of the convex is favorable to exceed 40% of average radius of the sphere consisting of the closed aspect surrounded by tracing the tip of the convex.

The reason is that such convex has the appropriate length that can secure the press-fitting to the concave, the electrical resistivity becomes much lower and the mechanical stability of the contact area can be improved.

Here, the average particle size of an Ag powder having a needle type convex as shown in FIG. 1(a) is about 6 μm and the average length of such convex is 2.6 μm. In addition, the average particle size of an Ag powder having a rod type convex as shown in FIG. 1(b) is about 11 μm and the average length of such convex is 3 μm. Further, the average particle size of an Ag powder having a petal type convex as shown in FIG. 1(c) is about 5 μm and the average length of such convex is 2 μm.

Thus, such Ag powder can secure the press-fitting to the concave and the electrical resistivity in condition that a resin is included becomes much lower and the mechanical stability of the contact area can be improved.

(2) Concave

The concave (sometimes called as dent) is favorable to be formed between the adjoining convex and to have the dent shape which can press-fit to the convex as illustratively shown in FIGS. 1(a), (b) and (c).

The reason is that the convex and concave can easily press-fit between the adjoining conductive powders to easily form the electrical path.

Also, the depth (length) of the concave can be expressed by the possessing volume in a conductive powder, namely a void of the concave in a conductive powder. More concretely, it is favorable that the void is to be set within a range of exceeding 40 vol. % when the total volume of the expected sphere consisting of the closed carve line connecting the tips of the concave is 100 vol. %.

The reason is that when the void is below 40 vol. %, the press-fitting between the convex and concave may become insufficient. On the other hand, when the void is too big, the may be the case where mechanical strength of the conductive powder becomes low.

Accordingly, it is more favorable that the void is to be set within a range of 42 to 70 vol. % and further more favorable that the void is within a range of 45 to 60 vol. %.

Here, the average particle size of the Ag powder having the needle type concave as shown in FIG. 1(a) is 6 μm and its void is 54 vol. %. Also, the average particle size of the Ag powder having the rod type concave as shown in FIG. 1(b) is 11 μm and its void is 49 vol. %. Further, the average particle size of the Ag powder having the petal type concave as shown in FIG. 1(c) is 5 μm and its void is 47 vol. %.

Thus, such Ag powder can secure the press-fitting to the concave and the electrical resistivity in condition that a resin is included becomes much lower and the mechanical stability of the contact area can be improved.

2. Average Particle Size

Further, it is favorable to set the average particle size of the conductive powder to a value, which is within a range of about 0.1 to 22 μm.

The reason is that, when the average particle size of the conductive powder assumes a value less than 0.1 μm, there may arise a case that a large quantity of the conductive powder is required to obtain the good conductivity. On the other hand, when the average particle size of the conductive powder exceeds 22 μm, there arises a case that the mixing and dispersion become difficult and the long making time is required.

Accordingly, it is more favorable to set the average particle size of the conductive powder to a value, which falls within a range of about 1 to 15 μm and it is further more favorable to set such an average particle size to a value, which falls within a range of about 3 to 10 μm.

Here, the average particle size of the conductive powder can be measured by using a laser-type particle counter, or directly computed by taking an image of the conductive powder into an optical microscope, or by computing the average particle diameter based on the image using an image processing apparatus.

3. Type of the Conductive Powder

As for such type of conductive powder, Ag or Ni is essential, but a single type or a combination of two or more selected from a group consisting of Au, Cu, Al, Fe, Zr, Tw, Sn, Pb, Solder and the like may be added.

Among these materials, Ag or Ni can ensure the favorable conductivity and can provide the relative cheap conductive powders. Also, Ag or Ni is easily dispersed in a resin, especially an epoxy resin or an acryl type resin.

4. Surface Treatment

Further, it is favorable to apply the surface treatment to surfaces of the conductive powder, especially the convex of the conductive powder by using the plating, the friction decreasing treatment and the like.

The reason is that applying the surface treatment can increase the mechanical strength of the convex of the conductive powder as well as the conductive powder itself, and the bending or the broken of the convex of the conductive powder can be easily protected.

Here, in the plating process, it is favorable that the thickness of plating is within a range of 0.01 to 3 μm in consideration of the plating effect and the like.

Also, as for the effect of the surface treatment, the convex and the concave of the adjoining conductive powders are press-fitted by sliding movement easily to form the electrical path.

Such surface treatment agent as favorable samples, are illustrated as silicone oils, fluorine resin type surface treatment agents and the several surfactants.

Here, it is favorable that the using quantity of the friction decreasing agent is set to be the value within a range of 0.1 to 30 pbw. based on 100 pbw. of the conductive powder, for example in consideration of the effects of the friction decreasing and the electrically insulating.

5. Electrical Properties (1) Electrical Resistivity (R)

Further, it is favorable that the electrical resistivity of the conductive powder in condition that a resin is included is set to be the value within a range of $5 \times 10^{-6}$ to $1 \times 10^{-3} \Omega \cdot cm$.

The reason is that when such electrical resistivity is below $5 \times 10^{-6} \Omega \cdot cm$, there may be the case where the available type of the conductive powder is too restricted or the making profit of the favorable conductive powder dramatically decreases. On the other hand, when such electrical resistivity is over $1 \times 10^{-3} \Omega \cdot cm$, there may be the case where the conductive resistance when used becomes high and the driving volts also becomes very high.

Accordingly, it is more favorable that the electrical resistivity of the conductive resin in condition that a resin is included, is set to be the value within a range of $5 \times 10^{-6}$ to $5 \times 10^{-4} \Omega \cdot cm$, and most favorable that the electrical resistivity is set to be the value within a range of $5 \times 10^{-6}$ to $1 \times 10^{-4} \Omega \cdot cm$.

Here, the electrical resistivity of a conductive powder in condition a resin is included, can be measured by the procedure later described in reference example 1.

(2) Thermal Coefficient of Resistance (TCR)

Further, it is favorable that thermal coefficient of resistance (TCR) of the conductive powder in condition that a resin is included is set to be the value within a range of $1 \times 10^{2}$ to $1 \times 10^{5}$ ppm/° C.

The reason is that when such TCR value is below $1 \times 10^{2}$ ppm/° C., there may be the case where the available type of the conductive powder is too restricted or the making profit of the favorable conductive powder dramatically decreases. On the other hand, when such TCR value is over $1 \times 10^{5}$ ppm/° C., there may be the case where the conductive resistance when used in the high temperature condition becomes high and the driving volts also becomes very high.

Accordingly, it is more favorable that TCR of the conductive powder is set to be the value within a range of $5 \times 10^{2}$ to $5 \times 10^{4}$ ppm/° C., and most favorable that TCR of the conductive powder is set to be the value within a range of $1 \times 10^{3}$ to $1 \times 10^{4}$ ppm/° C.

Here, TCR of a conductive powder can be measured by the procedure later described in reference example 1.

(3) Resistance Drift on Temperature Change (RD)

Further, it is favorable that the resistance drift on temperature change is set to be the value within a range of ±5%. The reason is that when the resistance drift on temperature change exceeds the range of ±5%, there may be the case where the conductive resistance when used in the high temperature condition becomes high and the driving volts also becomes very high.

However, when such resistance drift on temperature change is too small, there may be the cases where the available type of the conductive powder is too restricted or the making profit of the favorable conductive powder dramatically decreases.

Accordingly, it is more favorable that the resistance drift on temperature change of the conductive powder is set to be the value within a range of ±0.1 to 3%, and most favorable that the resistance drift on temperature change is set to be the value within a range of ±0.5 to 2%.

Here, the resistance drift on temperature change of the conductive powder can be measured by the procedure later described in reference example 1.

(4) Noise Factor (NF)

Further, it is favorable that noise factor of the conductive powder should be lower.

Here, it has been known that an electrical noise, which is different from a ground noise is produced when current through the contact points of metal particles. And such electrical noise gives the much effect on signal wave when it is overlapped with small signal voltage and high frequency voltage. Therefore, the electrical noise is one of the alternating voltages induced by several factors accompanying the contact points via potential barrier which controls the current and is a noise having a relative high frequency since carrier density or current was modulated.

However, when such electrically noise factor is too small, there may be the cases where the available type of the conductive powder is too restricted or the making profit of the favorable conductive powder dramatically decreases.

Accordingly, it is more favorable that the noise factor of the conductive powder is set to be the value within a range of 10 dB or less, more favorable to be the value within a range of −50 to 5 dB, and most favorable the noise factor of the conductive powder is set to be the value within a range of −30 to 0 dB.

Here, the noise factor of the conductive powder can be measured by the procedure later described in reference example 1.

6. Core Material

Figure 4:
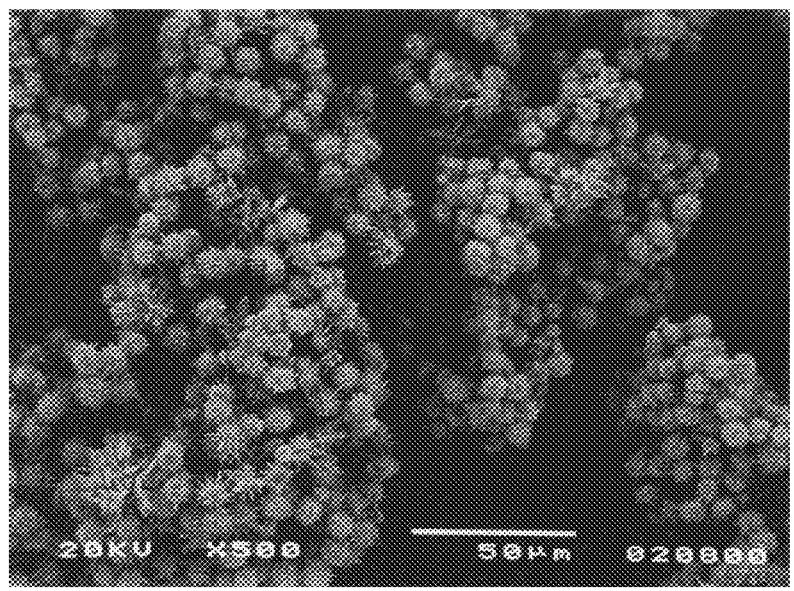
FIG. 4 is the electron microscope photos of the conductive powders including the core material (2 types) according to the present invention (×500, ×5000).
Figure 4:
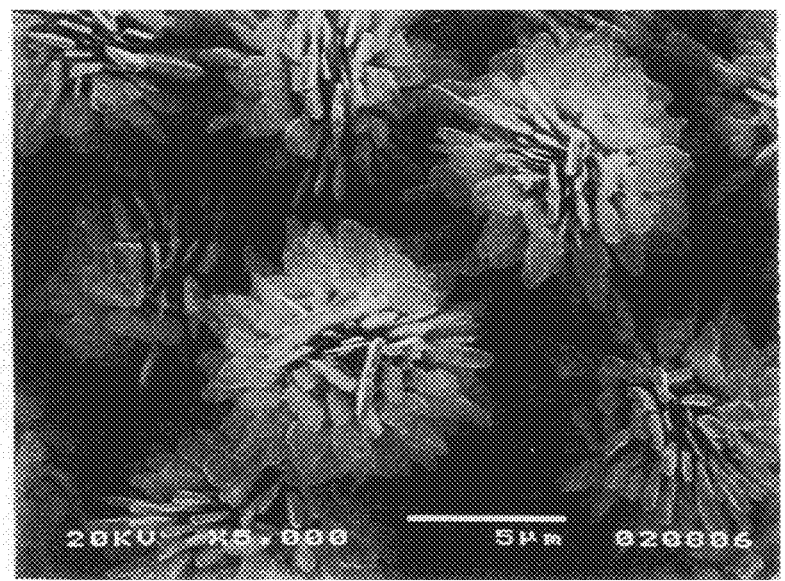

It is essential that a core material is included into a conductive powder in order to strengthen the crystal growth reaction. The reason is that the core material performs as the center of crystal growth reaction, the conductive material can extend uniformly to form the convex radially extended having the narrow particle size distribution as shown in FIG. 4. In addition, the specific shape can be retained for a long time since the core material is included into the conductive powder. Moreover, it becomes easy to control the specific gravity and the electrical resistivity since a definite quantity of the core material which specific gravity and the electrical resistivity are different, is included into the conductive powder.

Here, the configuration and the behavior of the core material after crystal growth reaction is not specially restricted in the condition that the core material can strengthen the crystal growth reaction to form the conductive powder having the narrow particle size distribution. Therefore, the core material can maintain partially inside the conductive powder, exist partially on the surface of the conductive powder, or remove partially from the conductive powder.

(1) Type

It is favorable that the core material is at least one particle selected from the group consisting of an organic type particle, a metal type particle and a ceramic type particle.

The reason is that it becomes easy to control the specific gravity and the particle size of the conductive powder as well as shaping retaining ability and electrical resistivity by using an organic type particle and a metal type particle. Further, it becomes easy to control the specific gravity and the particle size of the conductive powder as well as shaping retaining ability and heat resistance by using a ceramic type particle.

As for the organic type particle, one or more particle such as a styrene particle, acrylic particle, polycarbonate particle, olefin particle, silicone particle, urethane particle, protein particle, cellulose particle, rubber particle, polyamide particle, fluorine compound particle, fenole particle, graphite particle, and active carbon particle are illustrated.

As for the metal type particle, one or more particle such as silver (Ag) particle, gold (Au) particle, copper (Cu) particle, aluminum (Al) particle, zinc (Zn) particle, solder particle, tin (Sn) particle, nickel (Ni) particle are illustrated.

As for the ceramic type particle, one or more particle such as silica particle (white carbon), titanium oxide particle, zirconium oxide particle, aluminum oxide particle, zinc oxide particle, tin oxide particle, niobium oxide particle are illustrated.

Especially, silica particle (white carbon) and titanium oxide particle are more favorable core material since they can easily and remarkably control the specific gravity and the particle size of the conductive powder as well as electrical resistivity and shaping retaining ability.

As for the other type of core material, it is favorable that the core material is porous or aggregated particles. The reason is that the core material performs as the center of crystal growth reaction, the conductive material can extend uniformly to form the convex radially extended having the narrow particle size distribution and as well as good shaping retaining ability.

Accordingly, it is favorable that the BET area (specific area measured by BET method) of the core material is set to be the value within a range of 0.01 to 500 m$^2$/g.

Here, as to whether the core material is porous or not can be measured by using an electron microscope.

(2) Average Particle Size

Further, it is favorable to set the average particle size (S1) of the core material to a value, which is within a range of about 0.01 to 10 μm.

The reason is that when the average particle size of the core material is below 0.01 μm, there may be the case where the uniform extending of the convex from the core material becomes difficult. On the other hand, when such average particle size of the core material is over 10 μm, there may be the case where the controlling of the specific gravity and the average particle size of the conductive powder, the uniform extending of the convex from the core material becomes difficult.

Accordingly, it is more favorable to set the average particle size of the core material to a value, which is within a range of about 0.1 to 5 μm and it is further more favorable to set such an average particle size to a value, which is within a range of about 0.5 to 3 μm.

Here, it is favorable to set the average particle size (S1) of the core material with respect to the average particle size (S2) of the conductive powder. So, it is favorable to meet the relationship such as S1<S2.

The reason is that the uniform extending of the convex may be carried out from the core material, if the above-relationship is met.

Accordingly, it is more favorable to meet the relationship such as S1<0.1×S2, and it is further more favorable to meet the relationship such as S1<0.05×S2.

(3) BET Area

Further, it is favorable to set BET Area (specific area measured by BET method) of the core material to a value within a range of about 0.01 to 500 m$^2$/g.

The reason is that when such BET Area of the core material is below 0.01 m$^2$/g, there may be the case where the uniform extending of the convex from the core material becomes difficult. On the other hand, when such BET Area of the core material average is over 500 m$^2$/g, there may be the case where the core materials gather respectively to form the aggregated particles and the controlling of the specific gravity and the average particle size of the conductive powder, the uniform extending of the convex from the core material becomes difficult.

Accordingly, it is more favorable to set the BET Area of the core material to a value, which is within a range of about 0.1 to 300 m²/g and it is further more favorable to set such BET Area to a value, which is within a range of about 1 to 250 m²/g.

(4) Surface Treatment

It is favorable to apply the surface treatment to surfaces of the core material. The reason is that applying such surface treatment can modify the surface activity such as hydrophilic or hydrophobic. In other words, when it is difficult that the uniform and radical extending of the convex from the core material, the surface modification can eliminate such drawbacks.

By applying such surface treatment, it is favorable to use the specific silane coupling agent and titanium coupling agent, namely the silane coupling agent and titanium coupling agent having a hydrophilic group or a hydrophobic group. The reason is that such silane coupling agent and titanium coupling agent can be easily applied on to the surface of the core material by proper mixing them.

(5) Additional Quantity

As for the additional quantity of a core material, it is favorable that the additional quantity of the core material is set to be the value within a range of 0.01 to 30 wt. % based on the total weight.

The reason is that when such additional quantity is below 0.01 wt. %, there may be the case where the extending uniformly of the convex from the core material becomes difficult. On the other hand, when such additional quantity is over 30 wt. %, there may be the case where the conductive resistivity of the conductive powder becomes remarkably high.

Accordingly, it is more favorable that the additional quantity of a core material is set to be the value within a range of 0.1 to 20 wt. %, and still more favorable that such additional quantity is set to be the value within a range of 0.5 to 10 pbw.

Here, if the additional quantity of a core material is over the definite value, for example, over 1 wt. %, as a one method, Electrical photon micro analyzer (EPMA) can be available. If the additional quantity of a core material is comparative small, the other method should be used.

7. Producing Method

In producing the conductive powder according to the first embodiment, it is favorable to use so called solution reduction method. Thus, there is provided a producing method for an Ag or Ni conductive powder having a convex radially extended and a concave among the convex by using the solution reduction method, wherein the following steps (a) to (b) are included.

(a) To prepare step a core material to strengthen the crystal reaction such as Ag or Ni,
(b) To form an Ag or Ni conductive powder by reaction Ag nitrate or Ni nitrate with the reduction agent at the presence of the core material.

Therefore, it is favorable to produce the conductive powder having the specific shape by deposition from the specific reduction reaction between the metal salt or metal complex in the presence of the core material in a metal solution and a definite amount of the reducing agent.

(1) Metal Salt Solution (Ag Nitrate or Ni Nitrate)

It is favorable that the metal content in the metal salt solution (including metal complex solution) is set to be the value within a range of 0.1 to 3 mol/litter.

The reason is that when such metal content is below 0.1 mol/litter, there may be the case where the deposited volume of the conductive powder is too small and the making profit of the favorable conductive powder decreases. On the other hand, when such metal content is over 3 mol/litter, the control of the shape of the conductive powder becomes difficult and the making profit of the favorable conductive powder similarly decreases.

Accordingly, it is more favorable that the metal content in the metal salt solution is set to be the value within a range of 0.2 to 2.5 mol/litter, and most favorable the metal content is set to be the value within a range of 0.3 to 2 mol/litter.

Also, it is favorable to adjust the metal content in the metal salt solution according to the formation of the desired convex. For example, when the conductive powder having the needle type and rod type convex should be formed, it is favorable to set the metal content in the metal salt solution to be the value within a range of 0.8 to 2 mol/litter, whereby the desired convex can be easily formed. Further, the conductive powder having the petal type convex should be formed, it is favorable to set the metal content in the metal salt solution to be the value within a range of 0.3 to 0.7 mol/litter, whereby the desired type convex can be easily formed.

(2) Reducing Agent

As for a reducing agent, a single type or a combination of two or more selected from a group consisting of formaldehyde, sodium borohydride, hydrazine, hydrazine compound, hydroquinone, L-ascorbic acid, pyrocatechol, grape sugar, sodium hypophosphite, sulfate, formic acid, sodium sulfurous anhydride, L-tartaric acid, ammonium formate, rongalite are illustrated.

Among such reducing agents, the single use of L-ascorbic acid or the combined use of L-ascorbic acid and pyrocatechol are more favorable.

Further, it is favorable that the additional quantity of such reducing agent is set to be the value within a range of 0.1 to 3 mol/litter.

The reason is that when such reducing agent level is below 0.1 mol/litter, there may be the case where the deposited volume of the conductive powder is too small and the making profit of the favorable conductive powder decreases. On the other hand, when such reducing agent level is over 3 mol/litter, the control of the shape of the conductive powder becomes difficult and the making profit of the favorable conductive powder similarly decreases.

Accordingly, it is more favorable that the additional quantity of such reducing agent is set to be the value within a range of 0.2 to 2.5 mol/litter, and most favorable that the additional quantity of such reducing agent is set to be the value within a range of 0.3 to 2 mol/litter.

Also, it is favorable to adjust the reducing agent according to the formation of the desired convex. For example, when the conductive powder having the needle type convex should be formed, it is favorable to set the reducing agent content to be the value within a range of 0.8 to 2 mol/little, whereby the desired needle convex can be easily formed. Further, the conductive powder having the rod type or petal type convex should be formed, it is favorable to set the reducing agent content to be the value within a range of 0.3 to 0.7 mol/little, whereby the desired convex can be easily formed.

Here, in step (a), it is favorable to prepare the reduction solution including a core material to strengthen the crystal reaction in the content of 0.0001 to 1 wt. % to the total value of the reduction solution.

The reason is, by incorporating a core material into the reduction solution in the fixed amount, it is easy to regulate the content of the core material and to form the conductive powder having the specific average particle size.

Accordingly, in step (a), it is more favorable to prepare the reduction solution including a core material to strengthen the crystal reaction in the content of 0.001 to 0.5 wt. % to the total value of the reduction solution, and 0.003 to 0.1 wt. % to the total value of the reduction solution.

(3) Reducing Temperature

Further, it is favorable that the reducing temperature (reaction temperature) is set to be the value within a range of 0 to 30° C.

The reason is that when such reducing temperature is below 0° C., there may be the case where the deposited volume of the conductive powder is too small and the making profit of the favorable conductive powder decreases. On the other hand, when such reducing temperature is over 30° C., the control of the shape of the conductive powder becomes difficult and the making profit of the favorable conductive powder similarly decreases.

Accordingly, it is more favorable that the reducing temperature is set to be the value within a range of 3 to 25° C., and still more favorable that the reducing temperature is set to be the value within a range of 5 to 20° C.

(4) Ultrasonic Vibration

Further, it is favorable that the ultrasonic vibration is added in the carrying out of the reduction treatment. By carrying out the reduction treatment in this way, cavitation ban be produced in the metal salt solution. Accordingly, it is easy to produce the conductive powder having the needle type, rod type and petal type convex by control the deposition direction with the aid of such cavitation.

In adding the ultrasonic vibration, it is favorable that a piezoelectric device, (an electrical strain vibration device or a magnetic strain vibration device) are used in the frequency of 20 kHz to 3000 kHz. Moreover, it is favorable to change the frequency of the ultrasonic vibration and adding time of the ultrasonic vibration according to the desired convex shape and length.

(5) Producing Device

Figure 5:
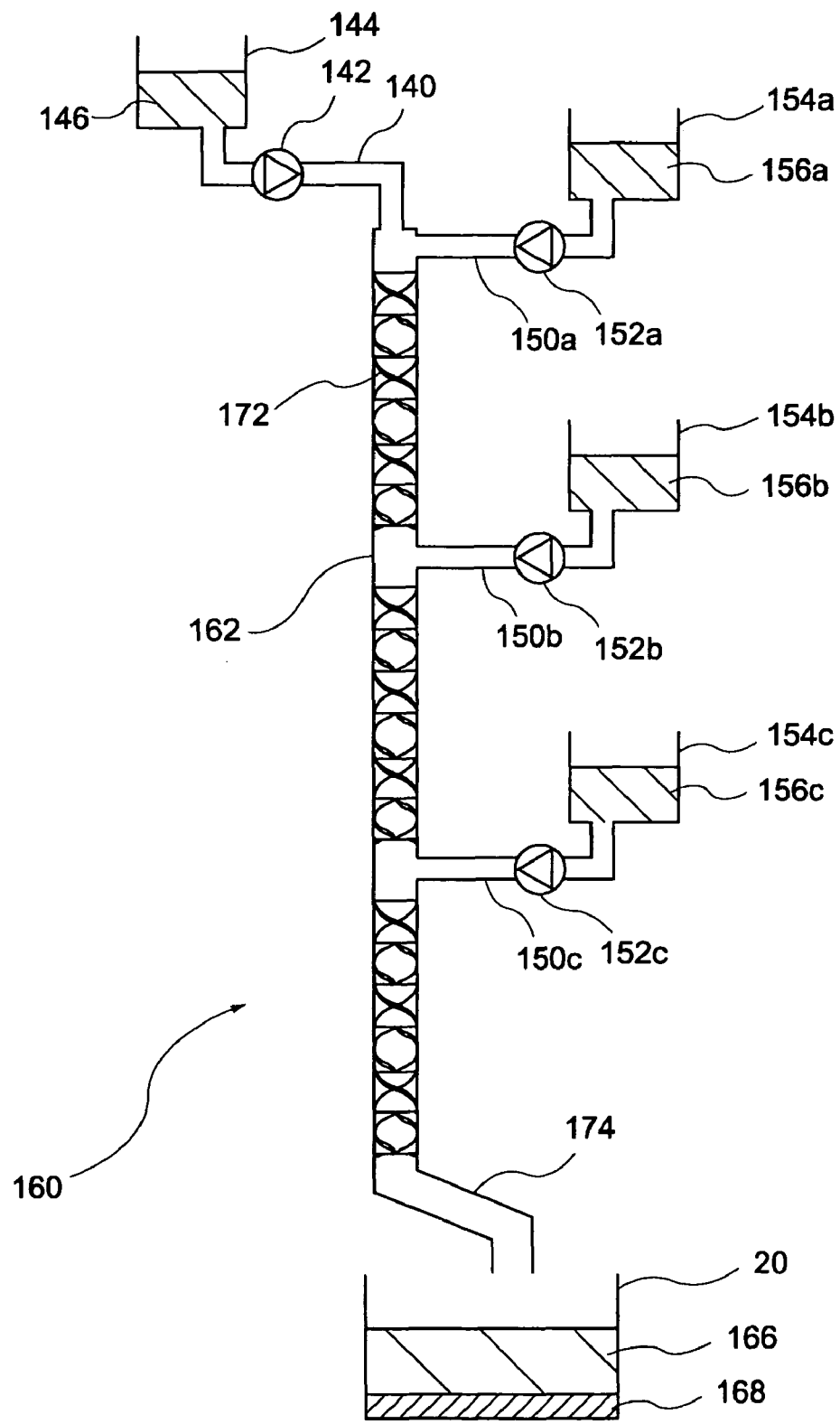
FIG. 5 is a drawing showing the producing device for the conductive powders including the core material (No. 1).
Figure 6:
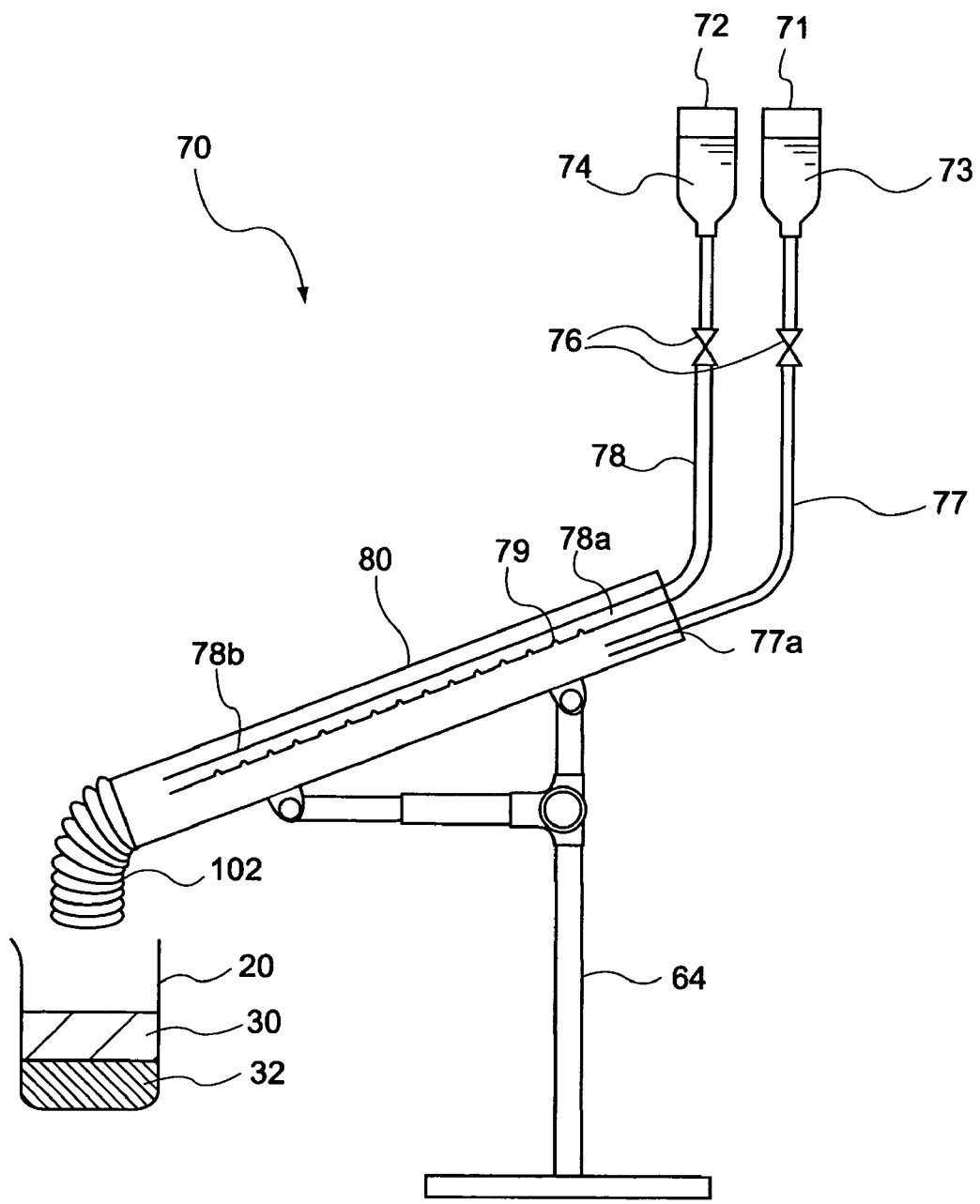
FIG. 6 is a drawing showing the producing device for the conductive powders including the core material (No. 2).

The type of the producing device 160 for producing the conductive powder according to the first embodiment is not limited, but it is favorable to provide with a housing 162 for falling dawn or conveying a reducing agent 146 at pressing state, a metal solution 156a, 156b, 156c and a mixing device 172 provided in the housing 162 as shown in FIG. 5. Also, as shown in FIG. 6, the producing device is favorably directed to a device for producing the conductive powder from a metal solution 73 and a reducing agent 74, and it is favorable to provide a first pipe 80 and a second pipe 78 as a housing for flowing a metal solution 73 and a reducing agent 74, the second pipe 78 inserted in the first pipe 80, some holes 79 for contacting the metal solution 73 and the reducing agent 74 provided on the second pipe 78 to construct the producing device 70.

The reason is that such producing device can mix a metal solution and a reducing agent while falling down or conveying at the pressing state and can agitate them compulsory and uniformly. Therefore, its is efficiently to produce the metal powder having the special shape such as radially extending concave and convex, the metal powder including the core material and the comparatively bigger size metal powder since their controlling of the particle size becomes easier.

Second Embodiment

Second embodiment of the present invention is directed to a conductive composition using a conductive powder having a convex radially extended and a concave between the convex, wherein a core material which is at least one particle selected from the group consisting of an organic type particle, a metal type particle and a ceramic type particle is included into the conductive powder.

Also, it is favorable for the conductive powder to have the following features;

(1) the convex and concave of the adjoining conductive powders are mutually press-fitted to form a conductive path (first feature).
(2) the shape of the convex is at least one shape selected from the group essentially consisting of the needle shape, a rod shape and a petal shape (second feature).
(3) the electrical resistivity is within a range of $5 \times 10^{-6}$ to $1 \times 10^{-3}$ $\Omega \cdot$cm in condition that a resin is included according to the measurement method described in reference example 1 (third feature).

1. Conductive Powder (1) Configuration

Since same conductive powders are available as the first embodiment, such explanation here is abbreviated.

(2) Additional Quantity 1

As for the additional quantity of a conductive powder into a resin, it is changeable and adjustable according to the several usages. For example, it is favorable that the additional quantity of the conductive powder is set to be the value within a range of 1 to 900 pbw. based on the 100 pbw. of a resin.

The reason is that when such additional quantity is below 1 pbw., there may be the case where the electrical resistivity of the conductive composition becomes too high. On the other hand, when such additional quantity is over 900 pbw., there may be the case where the adhesion strength of the obtainable conductive composition decreases, its viscosity becomes too high and the handling-ability becomes difficult.

Accordingly, it is more favorable that the additional quantity of a conductive powder into a resin is set to be the value within a range of 50 to 600 pbw. based on the 100 pbw. of a resin, and still more favorable that such additional quantity is set to be the value within a range of 100 to 400 pbw.

On the other hand, when a conductive composition is used as an isotropic conductive composition, it is more favorable that the additional quantity of a conductive powder into a resin is set to be the value within a range of 0.1 to 30 pbw. based on the 100 pbw. of a resin.

The reason is that when such additional quantity is below 0.1 pbw., there may be the case where the conductive resistance between the conductive members becomes too high, on the other hand, when such additional quantity is over 30 pbw., there may be the case where the short-circuits adjoining conductive members increase.

Accordingly, when a conductive composition is used as an isotropic conductive composition, it is more favorable that the additional quantity of a conductive powder into a resin is set to be the value within a range of 1 to 20 pbw. based on the 100 pbw. of a resin, and still more favorable that such additional quantity is set to be the value within a range of 3 to 10 pbw.

(3) Additional Quantity 2

Figure 3:
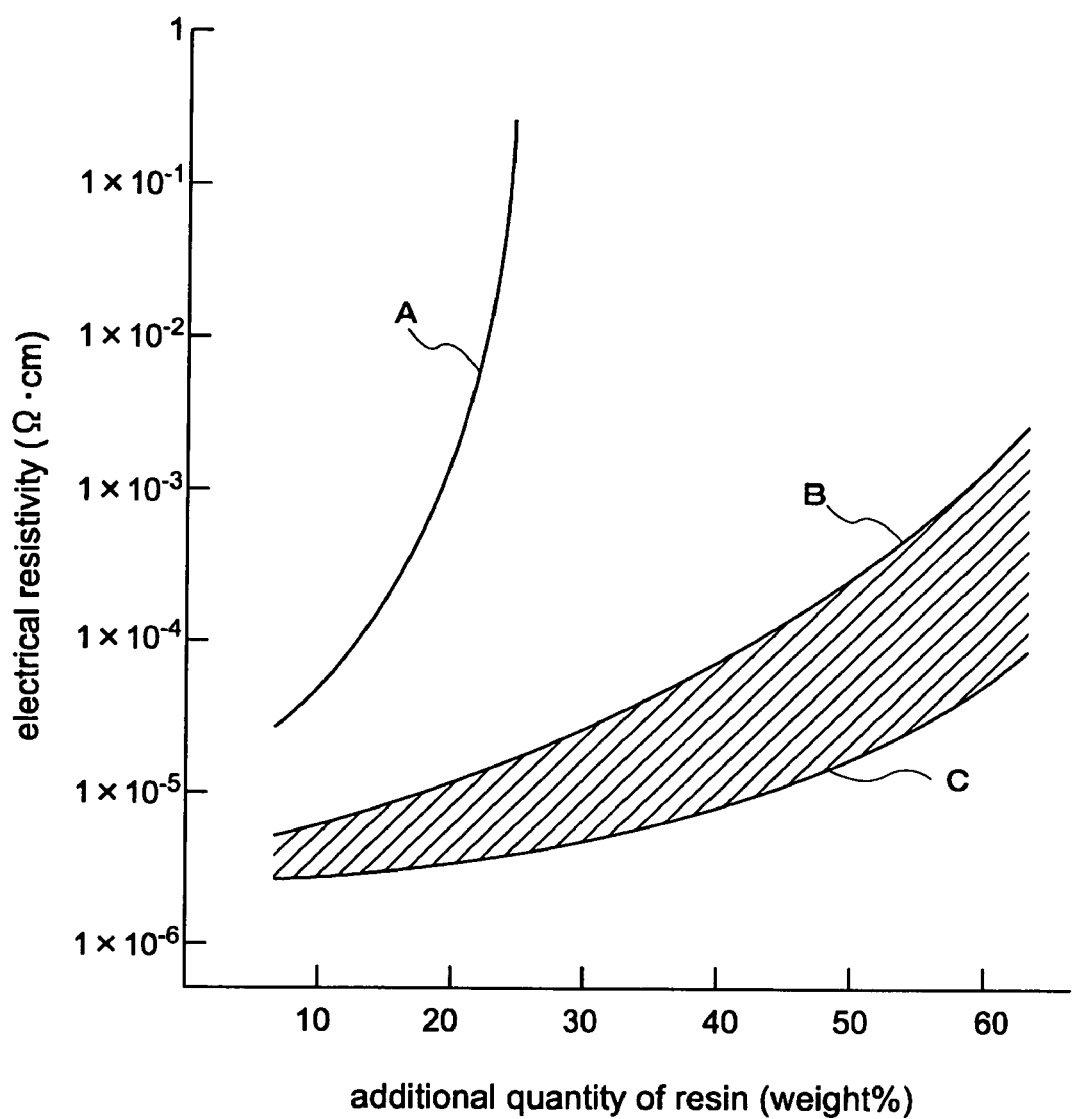
FIG. 3 is a drawing showing the relationship between a resin content and logarithmic number (electrical resistivity) according to the conductive composition.

Further, by referring to FIG. 3, the effect of resin/conductive powder on electrical resistivity is explained.

In FIG. 3, an additional quantity of resin (bis-phenol A type epoxy, weight %) is taken on an axis of abscissas and logarithmic electrical resistivity of the cured conductive composition ($\Omega \cdot$cm) is taken on a axis of ordinates. In FIG. 3, line A indicates the electrical property of the conventional conductive composition (comparative example) and the shaded area defined by line B and line C indicates the electrical property of the present invention's conductive composition (conductive powders A1 to A6 used in reference examples).

As can be understood from the FIG. 3, the present invention's conductive composition can show the low electrical resistivity such as $1 \times 10^{-3} \Omega \cdot cm$ or less, when an additional quantity of the conductive powder is 70 wt. % or more. Also, when an additional quantity of the conductive powder is below 70 wt. %, electrical resistivity becomes gradually higher and when additional quantity of the conductive powder is about 60 wt. %, electrical resistivity becomes about $1 \times 10^{-2} \Omega \cdot cm$ which is still low. On the other hand, the conventional conductive composition shows the electrical resistivity of about $1 \times 10^{-2} \Omega \cdot cm$, when an additional quantity of the conductive powder is 70 wt. % or more. However, when an additional quantity of the conductive powder is below 60 wt. %, electrical resistivity becomes rapidly higher.

Therefore, according to the present conductive composition, when the conductive powder is added in the relative low level or the resin is added in the relative high level, very low electrical resistivity can be obtained in comparison with the conventional conductive composition. Accordingly, depending on the usage, it is favorable to set the additional quantity of the conductive powder to be the value of about 1 to 900 wt. % based on the 100 pbw of a resin (including curing agent).

(4) Conductive Powder Other than the Conductive Powder Having the Convex and Concave It is favorable to add the conductive powders other than the conductive powder having the convex and concave such as sphere type conductive powder and the flake type conductive powder and to set the additional quantity to be the value within a range of 1 to 90 wt. %. per total weight.

The reason is that the adding of the defined quantity of other conductive powders can increase the moldability and the workability of the conductive composition. Also, the reason is that when such additional quantity is below 1 pbw., there may be the case where the adding effect of other conductive powders becomes low, on the other hand, when such additional quantity is over 90 pbw., there may be the case where the electrical resistivity of the conductive composition increases.

Accordingly, it is more favorable that the additional quantity of the conductive powders other than the conductive powder having the convex and concave is set to be the value within a range of 10 to 65 pbw. per total weight.

2. Resin 1

As for a resin constituting a conductive composition, for example, a single type or a combination of two or more selected from a group consisting of an acrylic type resin, a silicone type resin, an ester type resin, an epoxy type resin, an oxetane type resin, a phenol type resin, a cyanate ester type resin, an urethane resin, an acrylic resin, a polyester resin, styrene-butadien-styrene copolymer (SBS resin), styrene-isoprene-styrene copolymer (SIS resin), and styrene-etylene-butylene-styrene copolymer (SEBS resin) are illustrated.

Among these resins, thermosetting type resins are more favorable since these thermosetting type resins have the low viscosity when used, have the good workability, and maintain the suitable electrical resistivity and mechanical properties for a long time.

On the other hand, it is favorable to use a thermoplastic resin such as a SBS resin, a SIS resin and a SEBS resin. By using these thermoplastic resins, the good creep resistance can be obtained since a physical crosslinking structure is formed. Also, such resin could be easily removed by using a solvent and the like when it is attached to the unfavorable site.

Here, when a thermoplastic resin such as a SBS resin, it is more favorable to add 10 to 150 pbw. of a tackifier resins such as a terpenphenol resin, terpen resin and the like based on the 100 pbw. of a thermoplastic resin since the better creep resistance can be obtained.

3. Resin 2

Further, as for a resin constituting a conductive composition, it is favorable to use a non-solvent type resin. It has been known that the air is formed and corrosion and conductive failure have occurred due to the organic solvent included in the conductive composition and residued after the drying process. So, by using a non-solvent type resin, the effect of the organic solvent can be prevented and the air formation and the corrosion between the conductors can be also prevented to obtain the good conductive properties for a long time.

According to the present invention, the good conductive properties can be obtained even in the low using level of the conductive powder in comparison with the conventional conductive composition. So, there is the merit that the proper viscosity and adequate workability as the conductive composition can be obtained even in condition that a non-solvent type resin is used.

Here, as for the type of a non-solvent type resin, an acrylic type resin, a silicone type resin, an ester type resin, an epoxy type resin, an oxetane type resin, a phenol type resin, a cyanate ester type resin, an urethane resin which are setting type resins and its viscosity before adding a conductive powder at room temperature is favorably in a range of 200 to 100,000 mPa·s, more favorably in a range of 500 to 15,000 mPa·s.

4. Additives

As for additives other than the above-mentioned additives, it is favorable to add one type only or a combination of two or more types of additives selected from a group consisting of an antioxidant, an ultraviolet ray absorption agent, metal ion inhibitor, a viscosity improvement agent, an inorganic filler, an organic filler, a carbon fiber, color materials, coupling agent and the like to the conductive composition.

Especially, since the conductive composition is easily oxidized by the presence of the conductive powder, it is favorable to add an amine type antioxidant, a fenole type antioxidant, phosphate type antioxidant and the like, as an antioxidant, in the range of 0.1 to 10 wt % based on the total weight.

5. Producing Method

As for the producing method of the conductive composition, it is not limited, but is favorable to use a propeller mixer and spatula and the like for mixing a definite amount of conductive powder into a resin to produce the conductive composition. Also, it is favorable to heat the part of resin to set its viscosity of 1,000 to 100,000 mPa·s (50° C.) to mix the conductive powder and a resin uniformly.

Moreover, it is favorable to apply the surface treatment to surfaces of the conductive powder by using coupling agents in advance to mix the conductive powder into a resin uniformly. For example, it is favorable to mix the conductive powder and 1 to 10 pbw of γ-aminopropyltrietoxysilane and the like based on the 100 pbw. of the conductive powder and then to add such conductive powder treated by silane coupling agents into a resin.

On the other hand, it is favorable to scatter a definite amount of the conductive powder on to the resin, which is formed as a film in advance or to arrange a conductive powder in the fixed position via an opening plate (filter) to produce a conductive composition. By producing the conductive composition like this, it can protect the convex of the conductive power and reduce the damage since the shear strength to the conductive power can be reduced for stirring the conductive power in the resin.

EXAMPLE

The present invention is explained in further detail based on examples hereinafter. However, the following explanation describes the present invention for an illustration purpose and the content of the present invention is not limited to such a description.

Reference Example 1

1. Producing of the Conductive Powder and its Evaluation (1) Producing of the Ag Powder Having the Needle Type Convex.

In a 50 ml container, 1 mol/litter of Ag nitrate was stored and cooled to obtain the solution having the temperature at 12 to 13° C. by using the cooling instrument Then, in the same container, 1 mol/litter of L-ascorbic acid was added to carry out the reduction reaction. Subsequently, the deposited material in the container was recovered, washed by water and dried to produce the Ag powder (A1) having the needle type convex.

(2) Producing of the Ag Powder Having the Rod Type Convex

In a 50 ml container, 1 mol/litter of Ag nitrate was stored and cooled to obtain the solution having the temperature at 12 to 13° C. by using the cooling instrument Then, in the same container, 0.5 mol/litter of L-ascorbic acid was added to carry out the reduction reaction. Subsequently, the deposited material in the container was recovered, washed by water and dried to produce the Ag powder (A5) having the rod type convex.

(3) Producing of the Ag Powder Having the Petal Type Convex

In a 50 ml container, 0.5 mol/litter of Ag nitrate was stored and cooled to obtain the solution having the temperature at 12 to 13° C. by using the cooling instrument Then, in the same container, 0.5 mol/litter of L-ascorbic acid was added to carry out the reduction reaction. Subsequently, the deposited material in the container was recovered, washed by water and dried to produce the Ag powder (A8) having the petal type convex.

2. Producing and Evaluation of the Conductive Composition (1) Producing of the Conductive Composition In a container provided with a stirrer, 15 pbw. of epikote 819 (manufactured by Yuka Shell Epoxy Kabushiki Kaisha) as a bis-phenol A type epoxy resin, 15 pbw. of epikote 152 (manufactured by Yuka Shell Epoxy Kabushiki Kaisha) as a phenol novolak type epoxy resin and 5 pbw. of YED-111 as arkylmonogyrcidylether were mixed and stirred uniformly to produce the resin mixture.

Then, 35 pbw. of the obtained resin mixture, 15 pbw. of Ag powder having the needle type convex (A1), 20 pbw. of Ag powder having the rod type convex (A5), and 30 pbw. of Ag powder having the petal type convex (A8) were mixed and stirred uniformly to form a paste type formulation.

Then, 20 pbw. of Epicure T (manufactured by Yuka Shell Epoxy Kabushiki Kaisha) as an aliphatic amine type curing agent was added to 100 pbw. of the obtained paste type formulation and was stirred uniformly to produce the conductive composition as reference example 1.

(2) Evaluation of the Conductive Composition (i) Electrical Resistivity (R)

The obtained conductive composition was screen-coated on the alumina magnetic substrate in a pattern of L: 1 mm×W: 100 mm×T: 100 µm and dried in condition of 180° C.×30 min. to produce the measurement sample for the electrical resistivity.

Then, the initial electrical resistance of the cured conductive composition was measured by using 4 terminals measurement method, and electrical resistivity (volume resistivity/Ω·cm) was calculated.

(ii) Thermal Coefficient of Resistance (TCR)

The obtained conductive composition was screen-coated on the alumina magnetic substrate in a pattern of L:2 mm×W: 40 mm×T:30 µm and cured in condition of 180° C.×30 min. to produce the measurement sample of thermal coefficient of resistance.

Then, by using a programmable oven of 25 to 150° C., measurement samples were heated and its resistance change was measured by a differential transformer and a digital multimeter. From obtained data, thermal coefficient of resistance (TCR) of the cured conductive composition was calculated.

(iii) Resistance Drift on Temperature (RD)

The same measurement sample of thermal coefficient of resistance (TCR) was used to measure the resistance drift on temperature. Thus, by using 4 terminals measurement method, initial resistance (Ro,Ω) of the cured sample before measuring thermal coefficient of resistance (TCR) was measured and the cured sample was heated to 150° C. Then, the aged resistance (Rx,Ω) of the sample was measured after allowing to stand for 10 Hrs at 25° C. after backing to heating condition. From obtained resistances, resistance drift on temperature (%) of the cured conductive composition was calculated from the following equation.

$$RD(\%)=(Rx-Ro)/Ro\times 100$$

(iv) Noise Factor (NF)

The obtained conductive composition was screen-coated on the alumina magnetic substrate in a pattern of L:1000 mm×W:0.5 mm×T:100 µm and cured in condition at 180° C.×30 min. to produce the measurement sample of noise factor.

Then, by using resistance noise measurement instrument 315C (manufactured by Quan-Tech Co., in the USA), electrical noise potential ($E_1$) and standard electrical noise potential ($E_o$) of the cured sample were measured. From obtained data, noise factor (NF) of the cured conductive composition was calculated from the following equation.

$$NF(dB)=20\ Log(E_1/E_o)$$

(v) Adhesion

The obtained conductive composition was screen-coated on the Cu laminated printed circuit board in a pattern of L:5 mm×W:5 mm×T:50 µm and a Cu chip having the dimension of L:4 mm×W:4 mm×L:10 mm was adhered on the paste. Then, obtained sample was heated in condition at 180° C.×30 min., to produce the measurement sample of adhesion. Then, by using (an Amsler type tensile testing machine), the adhesion was measured as the releasing strength (kgf) when the Cu chip was removed from the Cu laminated printed circuit board

Reference Example 2

1. Producing of a Conductive Powder

As shown in table 1, the Ag powder having the needle type convex (A2), the Ag powder having the rod type convex (A6), and the Ag powder having the petal type convex (A7) were obtained in the changed deposition conditions from as described in reference example 1.

2. Producing and Evaluation of the Conductive Composition

In a container provided with a stirrer, 20 pbw. of epikote 819 (manufactured by Yuka Shell Epoxy Kabushiki Kaisha) as a bis-phenol A type epoxy resin, 10 pbw. of epikote 152 (manufactured by Yuka Shell Epoxy Kabushiki Kaisha) as a phenol novolak type epoxy resin and 5 pbw. of BGE as arkylmonogrycidylether were mixed and stirred uniformly to produce the resin mixture.

Then, 35 pbw. of the obtained resin mixture, 30 pbw. of Ag powder having the needle type convex (A2), 20 pbw. of Ag powder having the rod type convex (A6), and 15 pbw. of Ag powder having the petal type convex (A7) were mixed and stirred uniformly to form a paste type formulation.

Finally, 20 pbw. of epicure T (manufactured by Yuka Shell Epoxy Kabushiki Kaisha) as an aliphatic amine type curing agent was added to 100 pbw. of the obtained paste type formulation and was stirred uniformly to produce and evaluate the conductive composition as reference example 2.

Reference Example 3

1. Producing of a Conductive Powder

As shown in table 1, the Ag powder having the needle type convex (A3) and the Ag powder having the rod type convex (A4) were obtained in the freely changed deposition conditions as described in reference example 1. Also the Ag powder having the petal type convex (A8) was obtained procedure of reference example 1.

2. Producing and Evaluation of the Conductive Composition

In a container provided with a stirrer, 25 pbw. of epikote 819 (manufactured by Yuka Shell Epoxy Kabushiki Kaisha) as a bis-phenol A type epoxy resin, 5 pbw. of epikote 152 (manufactured by Yuka Shell Epoxy Kabushiki Kaisha) as a phenol novolak type epoxy resin and 5 pbw. of BGE as arkylmonogrycidylether were mixed and stirred uniformly to produce the resin mixture.

Then, 35 pbw. of the obtained resin mixture, 20 pbw. of Ag powder having the needle type convex (A3), 15 pbw. of Ag powder having the rod type convex (A4), and 30 pbw. of Ag powder having the petal type convex (A8) were mixed and stirred uniformly to form a paste type formulation.

Finally, 20 pbw. of above-described epicure T was added to 100 pbw. of the obtained paste type formulation and was stirred uniformly to produce and evaluate the conductive composition as reference example 3.

Reference Example 4

1. Producing of a Conductive Powder

Ni nitrate was used in place of Ag nitrate of reference example 1, and as shown in table 1, the Ni powder having the needle type convex (N1) and the Ni powder having the petal type convex (N2) were obtained in the freely changed deposition conditions as described in reference example 1.

2. Producing and Evaluation of the Conductive Composition

In a container provided with a stirrer, 15 pbw. of epikote 819, 10 pbw. of epikote 152 and 10 pbw. of YED-111 were mixed and stirred uniformly to produce the resin mixture.

Then, 35 pbw. of the obtained resin mixture, 15 pbw. of Ni powder having the needle type convex (N1), 11 pbw. of Ni powder having the petal type convex (N2), 10 pbw. of the commercially available sphere Ag powder (average particle size: 1 μm) and 29 pbw. of the commercially available flake Ag powder (average particle length: 10 μm) were mixed and stirred uniformly to form a paste type formulation.

Finally, 20 pbw. of above-described epicure T was added to 100 pbw. of the obtained paste type formulation and was stirred uniformly to produce and evaluate the conductive composition as reference example 4.

Reference Example 5

1. Producing of a Conductive Powder

As the conductive powders, the same Ni powder (N1) as example 4, the commercially available sphere Ag powder (average particle size: 1 μm) and the commercially available flake Ag powder (average particle length: 10 μm) were prepared.

2. Producing and Evaluation of the Conductive Composition

In a container provided with a stirrer, 15 pbw. of epikote 819, 10 pbw. of epikote 152 and 10 pbw. of BGE were mixed and stirred uniformly to produce the resin mixture.

Then, 35 pbw. of the obtained resin mixture, 26 pbw. of Ni powder having the needle type convex (N1), 10 pbw. of the commercially available sphere Ag powder (average particle size: 1 μm) and 29 pbw. of the commercially available flake Ag powder (average particle length: 10 μm) were mixed and stirred uniformly to form a paste type formulation.

Finally, 20 pbw. of above-described epicure T was added to 100 pbw. of the obtained paste type formulation and was stirred uniformly to produce and evaluate the conductive composition as reference example 5.

Reference Example 6

1. Producing of a Conductive Powder

As the conductive powders, the same Ni powder (N2) as reference example 4, the commercially available sphere Ag powder (average particle size: 1 μm) and the commercially available flake Ag powder (average particle length: 10 μm) were prepared.

2. Producing and Evaluation of the Conductive Composition

In a container provided with a stirrer, 15 pbw. of epikote 819, 10 pbw. of epikote 152 and 10 pbw. of YED-111 were mixed and stirred uniformly to produce the resin mixture.

Then, 35 pbw. of the obtained resin mixture, 26 pbw. of Ni powder having the petal type convex (N2), 10 pbw. of the commercially available sphere Ag powder (average particle size: 1 μm) and 29 pbw. of the commercially available flake Ag powder (average particle length: 10 μm) were mixed and stirred uniformly to form a paste type formulation.

Finally, 20 pbw. of above-described epicure T was added to 100 pbw. of the obtained paste type formulation and was stirred uniformly to produce and evaluate the conductive composition as reference example 6.

Comparative Example 1

1. Preparation of the Conductive Powders

As the conductive powders, the commercially available sphere Ag powder (average particle size: 1 μm) and the commercially available flake Ag powder (average particle length: 10 μm) were prepared.

2. Producing and Evaluation of the Conductive Composition

In a container provided with a stirrer, 15 pbw. of epikote 819, 10 pbw. of epikote 152 and 10 pbw. of BGE were mixed and stirred uniformly to produce the resin mixture.

Then, 35 pbw. of the obtained resin mixture, 16.3 pbw. of the commercially available sphere Ag powder (average particle size: 1 μm) and 48.7 pbw. of the commercially available flake Ag powder (average particle length: 10 μm) were mixed and stirred uniformly to form a paste type formulation.

Finally, 20 pbw. of above-described epicure T was added to 100 pbw. of the obtained paste type formulation and was stirred uniformly to produce and evaluate the conductive composition as comparative example 1.

TABLE 1

| Conductive Powder | Convex shape | Average size (μm) | Convex length (μm) | Average void (Vol %) |
|---|---|---|---|---|
| Ag powder A 1 | needle | 1.0 | 0.2 | 43 |
| Ag powder A 2 | needle | 6.0 | 2.6 | 54 |
| Ag powder A 3 | needle | 18.4 | 5.2 | 55 |
| Ag powder A 4 | lod | 3.1 | 0.8 | 48 |
| Ag powder A 5 | lod | 11.0 | 3.0 | 49 |
| Ag powder A 6 | lod | 20.2 | 5.7 | 48 |
| Ag powder A 7 | petal | 2.0 | 0.6 | 50 |
| Ag powder A 8 | petal | 5.0 | 2.0 | 47 |
| Ni powder N 1 | needle | 3.4 | 1.0 | 46 |
| Ni powder N 2 | petal | 8.3 | 2.4 | 43 |

TABLE 2

| Compositions | Reference Example 1 | Reference Example 2 | Reference Example 3 | Reference Example 4 | Reference Example 5 | Reference Example 6 | Comp. Example 1 |
|---|---|---|---|---|---|---|---|
| Ag powder (A1) | 15 | | | | | | |
| Ag powder (A2) | | 30 | | | | | |
| Ag powder (A3) | | | 20 | | | | |
| Ag powder (A4) | | | | 15 | | | |
| Ag powder (A5) | 20 | | | | | | |
| Ag powder (A6) | | 20 | | | | | |
| Ag powder (A7) | | 15 | | | | | |
| Ag powder (A8) | 30 | | 30 | | | | |
| Ni powder (N1) | | | | | 15 | 26 | |
| Ni powder (N2) | | | | | 11 | | 26 |
| Spherical Ag powder | | | | | 10 | 10 | 10 | 16.3 |
| Ag flake powder | | | | | 29 | 29 | 29 | 48.7 |
| Epikote 819 | 15 | 20 | 25 | 15 | 15 | 15 | 15 |
| Epikote 152 | 15 | 10 | 5 | 10 | 10 | 10 | 10 |
| BGE | | | 5 | 5 | | 10 | | 10 |
| YED111 | 5 | | | 10 | | 10 | |
| Epicure T | 20 | 20 | 20 | 20 | 20 | 20 | 20 |
| R (Ω-cm) | $8.0 \times 10^{-6}$ | $1.1 \times 10^{-5}$ | $6.8 \times 10^{-6}$ | $8.3 \times 10^{-6}$ | $3.5 \times 10^{-5}$ | $9.0 \times 10^{-6}$ | $1.4 \times 10^{-3}$ |
| TCR (ppm/° C.) | $5.0 \times 10^{3}$ | $7.1 \times 10^{3}$ | $3.5 \times 10^{3}$ | $1.7 \times 10^{3}$ | $3.0 \times 10^{3}$ | $2.3 \times 10^{3}$ | $5.1 \times 10^{4}$ |
| RD (%) | 0.8 | 0.9 | 1.0 | 1.3 | 1.2 | 1.0 | 7.2 |
| NF (dB) | −19.5 | −20.7 | −19.3 | −22.0 | −20.8 | −23.0 | 38.7 |
| Adhesion (kgf) | 17.0 | 18.6 | 17.9 | 18.0 | 19.0 | 20.0 | 19.0 |

*R: Electrical resistivity
*TCR: Thermal coefficient of resistance
*RD: Resistance drift on temperature change
*NF: Noise factor

Example 1

1. Producing of the Conductive Powder and Conductive Composition (1) Producing of the Ag Powder Having the Needle Type Convex.

After preparing the production device having the static mixer as shown in FIG. 5, concentration of 1 mol/litter of Ag nitrate 50 ml and concentration of 1 mol/litter of L-ascorbic acid 50 ml including a silica particle as a core material (commercial name: aerosil #200 manufactured by Nippon Aerosil Co., Ltd., primary particle size: 12 nm, BET area: 200 m$^2$/g, additional quantity: 1 g/50 ml) were respectively poured from the different inlets and reacted. Then, the deposited crystal in the beaker was recovered, washed by water and dried, consequently to obtain Ag powder (A9) having the needle type concave and including inside silica particle of 0.9 wt. % (by EPMA) as shown in FIG. 4.

(2) Producing of the Conductive Composition

In a container provided with a stirrer, 50 pbw. of epikote 828 (manufactured by Japan Epoxy Resins Co., Ltd.), 10 pbw. of epicure Z (manufactured by Japan Epoxy Resins Co., Ltd.) and 200 pbw. of Ag powder (A9) obtained in the above step (1) were mixed and stirred uniformly to produce the conductive composition as shown in table 4.

Figure 7:
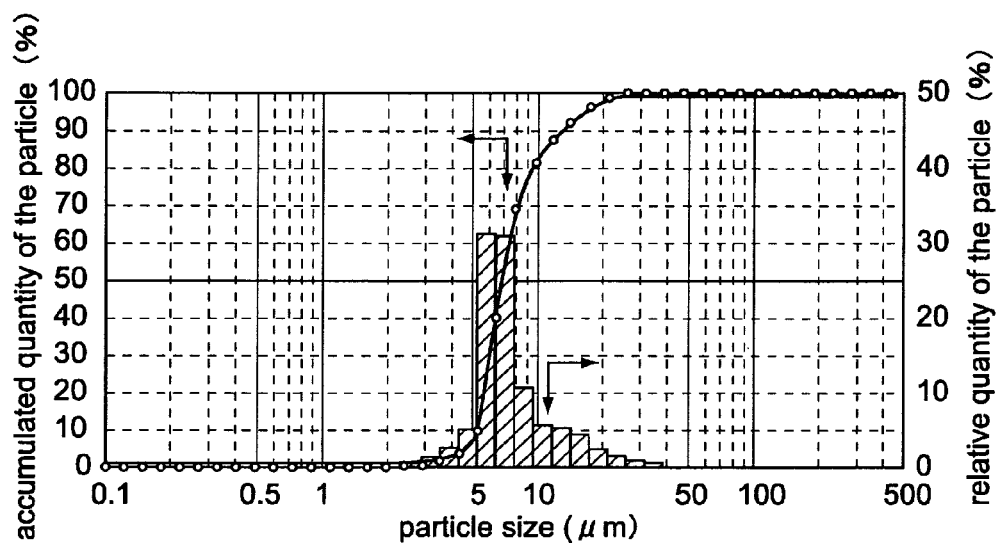
FIG. 7 is a drawing showing the particle size distribution of the conductive powders including the core material (example 1).

2. Evaluation of the Conductive Powder and Conductive Composition (1) Particle Size Distribution Obtained Ag powder (A9) was dispersed uniformly in water and then particle size distribution in the condition was measured by the laser measurement type size distribution meter SALD-3000 (manufactured by SHIMADZU CORPORATION). The particle size distribution chart was shown in FIG. 7 and its particle size distribution ability was evaluated in the following criteria. Obtained result was shown in table 3.

Very good: Standard deviation is within 40% of the average Ag particle size

Good: Standard deviation is within 50% of the average Ag particle size

Fair: Standard deviation is within 70% of the average Ag particle size

Bad: Standard deviation is over 70% of the average Ag particle size (2) Shape Retaining Ability Obtained Ag powder (A9) was dispersed uniformly in water at 25° C. and then shape retaining ability was evaluated from the observance change in the following criteria. Obtained result was shown in table 3.

Very good: No remarkable change after allowing to stand for more than 10 hrs.

Good: No remarkable change after allowing to stand for more than 5 hrs and below 10 hrs.

Fair: No remarkable change after allowing to stand for more than 3 hrs and below 5 hrs.

Bad: Remarkable change after allowing to stand for below 3 hrs.

(3) EPMA Analysis

Figure 8:
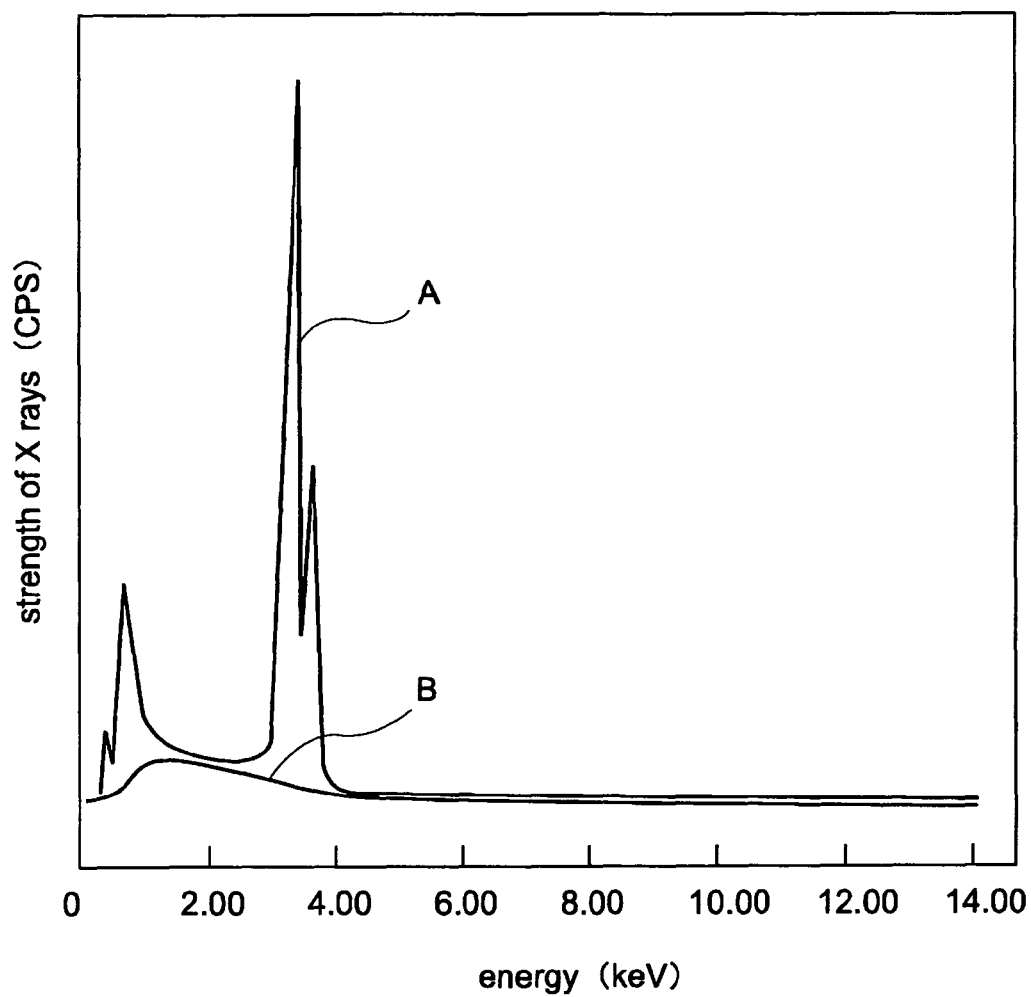
FIG. 8 is a drawing showing the EPMA chart of the conductive powders.

Element analysis was carried out for the obtained Ag powder (A9) by using EPMA (EDAX MODEL HIT S-3200 manufactured by EDAX Japan Co.). Obtained EPMA chart was shown in FIG. 8. From this result, 0.9 wt. % of silica was confirmed to be included.

(4) to (7) Electrical Resistivity (R), Thermal Coefficient of Resistance (TCR) Resistance Drift on Temperature Change (RD), Noise Factor (NF)

Obtained conductive composition's electrical resistivity, thermal coefficient of resistance (TCR), resistance drift on temperature change (RD), and noise factor (NF) were measured in the same manners as reference example 1 and shown in table 4.

(8) Adhesion

The obtained conductive composition was screen-coated on the Cu plate (L:120 mm×W:25 mm×T:2 mm) in a pattern of L:12.5 mm×W:25 mm×T:0.5 mm and other Cu plate (L:120 mm×W:25 mm×T:2 mm) was laminated. Then, obtained sample was heated in condition at 180° C.×30 min., to produce the measurement sample of adhesion. Then, by using an tension type testing machine RTC-1310A (manufactured by ORIENTEC CO., Ltd.), the adhesion was measured as the tensile strength (MPa) and shown in table 4.

Example 2

Except for changing the content of L-ascorbic acid from 1 mol/little of example 1 to 0.7 mol/little, same procedure and evaluations of example 1 were carried out to produce the conductive powder having the convex of the rod type (A10) and to produce the conductive composition. Obtained results were shown in table 4.

Examples 3 to 5

Except for changing the concentration of silica from 1 g/50 ml of example 1 to 0.5 g/50 ml (example 3), to 0.3 g/50 ml (example 4), and to 0.1 g/50 ml (example 5), same procedure and evaluations of example 1 were respectively carried out to produce the conductive powders having the convex of the needle type (A11 to A13) and to produce the conductive compositions. Obtained results were shown in table 4.

Comparative Example 2

In comparative example 2, except for not using silica of example 1, same procedure and evaluations of example 1 were carried out to produce the conductive powder having the convex of the needle type (A15) and to produce the conductive composition. Obtained results were shown in table 4.

Figure 9:
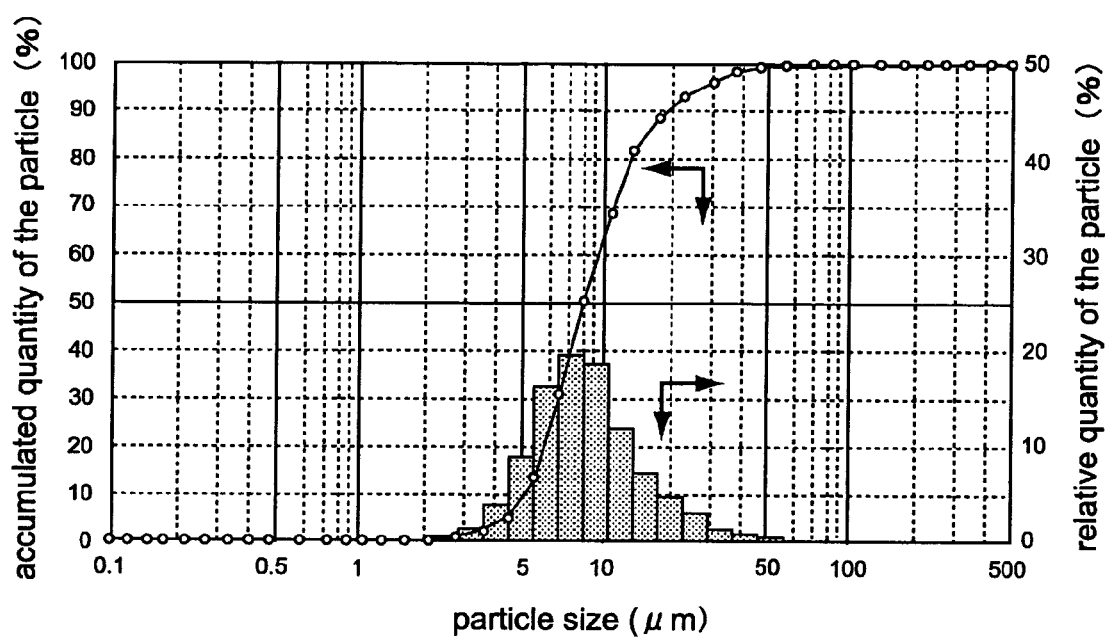
FIG. 9 is a drawing showing the particle size distribution of the conductive powders without including the core material (comparative example 2).

Also, FIG. 9 shows a drawing showing the particle size distribution of the conductive powders without including the core material (comparative example 2).

Example 6

In example 6, except for using the Ag powder (particle size: 1.5 µm, additional quantity: 3 g/50 ml) in place of silica of example 1, same procedure and evaluations of example 1 were carried out to produce the conductive powder having the convex of the needle type (A14) and to produce the conductive composition. Obtained results were shown in table 4.

TABLE 3

| Conductive powder | Core material | Convex Shape | Average size (μm) | Convex length (μm) | Average void (Vol %) | Particle size distribution | Shape retaining ability |
|---|---|---|---|---|---|---|---|
| Ag powder A 9 | silica 1 g/50 ml | Flake | 7 | 1.5 | 60 | very good | very good |
| Ag powder A 10 | silica 1 g/50 ml | Flake | 7 | 1.0 | 50 | very good | very good |
| Ag powder A 11 | silica 0.5 g/50 ml | Flake | 7 | 1.5 | 60 | very good | very good |
| Ag powder A 12 | Silica 0.3 g/50 ml | needle | 7 | 1.5 | 60 | good | very good |
| Ag powder A 13 | Silica 0.1 g/50 ml | needle | 7 | 2.0 | 70 | good | very good |
| Ag powder A 14 | Ag 3 g/50 ml | needle | 3 | 0.5 | 70 | good | very good |
| Ag powder A 15 | No | needle | 9 | 2.5 | 70 | fair | fair |

TABLE 4

| Compositions | Example 1 | Example 2 | Example 3 | Example 4 | Example 5 | Example 6 | Comp. Example 2 |
|---|---|---|---|---|---|---|---|
| Ag powder (A 9) | 200 | | | | | | |
| Ag powder (A 10) | | 200 | | | | | |
| Ag powder (A 11) | | | 200 | | | | |
| Ag powder (A 12) | | | | 200 | | | |
| Ag powder (A 13) | | | | | 200 | | |
| Ag powder (A 14) | | | | | | 200 | |
| Ag powder (A 15) | | | | | | | 200 |
| Epikote 828 | 50 | 50 | 50 | 50 | 50 | 50 | 50 |
| Epicure Z | 10 | 10 | 10 | 10 | 10 | 10 | 10 |
| R (Ω·cm) | $7.8 \times 10^{-5}$ | $8.8 \times 10^{-5}$ | $9.6 \times 10^{-5}$ | $7.5 \times 10^{-5}$ | $8.1 \times 10^{-5}$ | $8.5 \times 10^{-5}$ | $2.1 \times 10^{-4}$ |
| TCR (ppm/°C.) | $2.5 \times 10^{3}$ | $6.8 \times 10^{3}$ | $3.8 \times 10^{3}$ | $4.3 \times 10^{3}$ | $5.2 \times 10^{3}$ | $4.8 \times 10^{3}$ | $3.8 \times 10^{3}$ |
| RD (%) | 1.1 | 1.8 | 1.7 | 1.2 | 2.5 | 1.9 | 2.6 |
| NF (dB) | −6.5 | −4.2 | −9.7 | −3.8 | −1.9 | −8.7 | −2.4 |
| Adhesion (MPa) | 10.8 | 12.5 | 9.8 | 11.9 | 9.9 | 12.8 | 6.2 |

Examples 7 to 13

Figure 10:
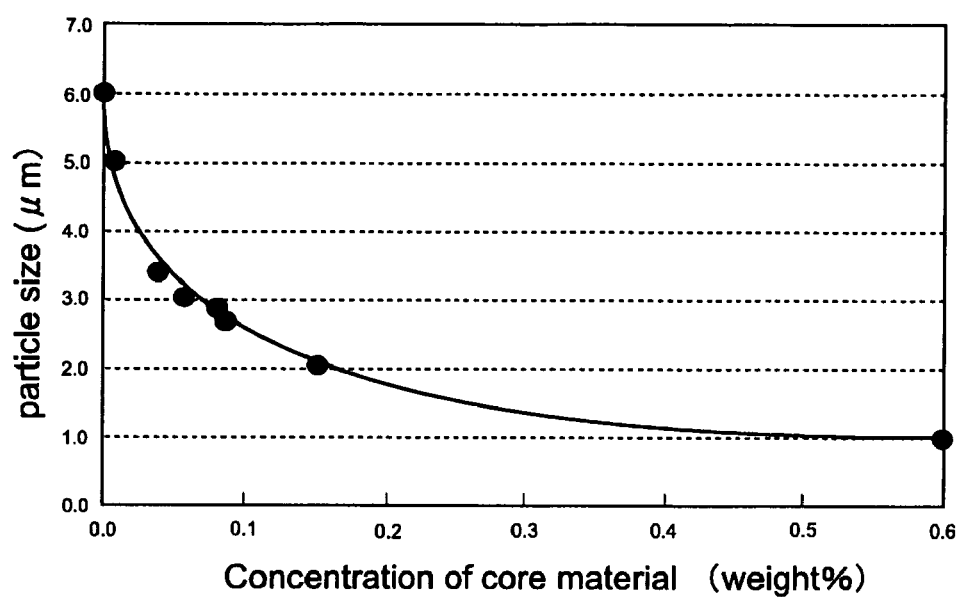
FIG. 10 is a drawing showing the relationship between the core material particle content (wt. %) and the average particle size (um)
Figure 11:
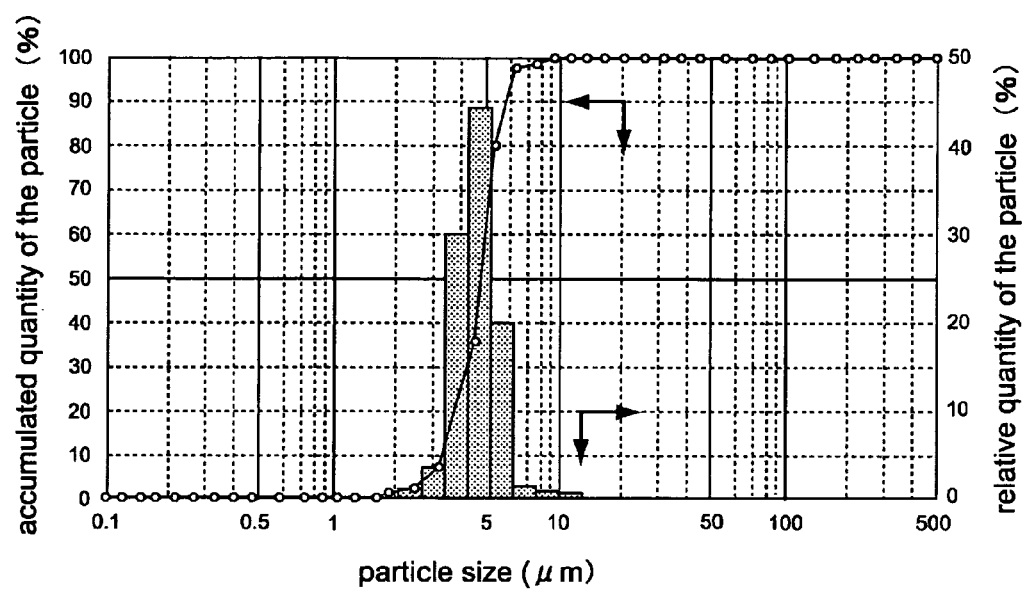
FIG. 11 is a drawing showing the particle size distribution of the conductive powders including the core material (example 7).

In examples 7 to 13, the particle size of Ag core material and the consent of Ag core material have been studied as Table 5 in place of Ag core material (particle size: 1.5 μm, additional quantity: 3 g/50 ml) in the example 6. Obtained results were shown in table 5. FIG. 10 shows the relationship between the core material particle content (wt. %) and the average particle size (um). Also, FIG. 11 shows the particle size distribution of the conductive powders including the core material (example 7).

TABLE 5

| Conductive Powder | Example 7 | Example 8 | Example 9 | Example 10 | Example 11 | Example 12 | Example 13 |
|---|---|---|---|---|---|---|---|
| Core material kind | Ag | Ag | Ag | Ag | Ag | Ag | Ag |
| Average Particle Size(um) | 0.1 | 0.1 | 0.1 | 0.1 | 0.1 | 0.1 | 0.1 |
| Conc.* (wt. %) | 0.0015 | 0.003 | 0.006 | 0.009 | 0.0105 | 0.015 | 0.060 |
| Metal salt solution | Ag nitrate | Ag nitrate | Ag nitrate | Ag nitrate | Ag nitrate | Ag nitrate | Ag nitrate |
| Reduction agent | ascorbic acid | ascorbic acid | ascorbic acid | ascorbic acid | ascorbic acid | ascorbic acid | ascorbic acid |
| Reaction Temp. (°C.) | 20 | 20 | 20 | 20 | 20 | 20 | 20 |

TABLE 5-continued

| Conductive Powder | Example 7 | Example 8 | Example 9 | Example 10 | Example 11 | Example 12 | Example 13 |
|---|---|---|---|---|---|---|---|
| Average Particle Size(um) | 5.0 | 3.5 | 3.0 | 2.8 | 2.5 | 2.0 | 1.0 |

*Core material weight(g) in 100 g of L-ascorbic acid(1 mol/litter)

INDUSTRIAL APPLICABILITY

As above-described, according to the present conductive powder and its producing method, by including the core material for uniform crystal growth into the conductive powder, it can provide the conductive powder having the narrow particle size distribution and low electrical resistivity since the contact area becomes bigger between the adjoining conductive powders, and good shape retaining ability.

Also, according to the present conductive composition, the electrical resistance becomes lower even in condition that the additional quantity of the conductive powder is relative low and the handling-ability becomes better by using the conductive powder having a convex radially extended and a concave among the convex, wherein the said convex and concave of the adjoining conductive powders being mutually press-fitted, or by using the conductive powder having a convex radially extended and a concave among the convex, wherein the shape of the convex being at least one shape selected from the group essentially consisting of the needle shape, a rod shape and a petal shape, and by using the conductive powder having a convex radially extended and a concave among the convex, wherein the electrical resistivity is within a range of $5\times10^{-6}$ to $1\times10^{-3}$ Ω·cm in condition that a resin is included.

What is claimed is:

1. A producing method for an Ag or Ni conductive powder having a convex radially extended and a concave among the convex, wherein a core material to strengthen the crystal reaction such as Ag or Ni, which is at least one particle selected from the group consisting of an organic particle, a metal particle and a ceramic particle and which concentration is within a range of 0.01 to 30 wt. % based on the total weight of the conductive powder is included into the conductive powder by using the solution reduction method, wherein the following steps (a) to (b) are included:

(a) preparing a core material to strengthen the crystal reaction such as Ag or Ni, (b) forming an Ag or Ni conductive powder by reacting Ag nitrate or Ni nitrate with a reduction agent in the presence of the core material.

2. The producing method for an Ag or Ni conductive powder according to claim 1, wherein the average particle size (S1) of the core material is within a range of about 0.01 to 10 μm in the step (a).

3. The producing method for an Ag or Ni conductive powder according to claim 1, wherein a concentration of the core material is within a range of about 0.0001 to 1 wt. % in the reduction agent of step (b).

4. The producing method for an Ag or Ni conductive powder according to claim 1, wherein the reaction temperature is within a range of about 0 to 30° C. in the step (b).

* * * * *